US011082550B2

(12) United States Patent
Rouaissia et al.

(10) Patent No.: US 11,082,550 B2
(45) Date of Patent: Aug. 3, 2021

(54) PROXIMITY SENSOR AND MOBILE WIRELESS DEVICE

(71) Applicant: Semtech Corporation, Camarillo, CA (US)

(72) Inventors: Chaouki Rouaissia, Neuchâtel (CH); Hehai Zheng, Hunan Province (CN)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 16/413,119

(22) Filed: May 15, 2019

(65) Prior Publication Data

US 2020/0014789 A1    Jan. 9, 2020

Related U.S. Application Data

(60) Provisional application No. 62/695,533, filed on Jul. 9, 2018.

(51) Int. Cl.
*H04M 1/72454* (2021.01)
*G06F 3/044* (2006.01)
*H04B 1/3827* (2015.01)

(52) U.S. Cl.
CPC ........ *H04M 1/72454* (2021.01); *G06F 3/044* (2013.01); *H04B 1/3838* (2013.01)

(58) Field of Classification Search
CPC ... G06F 3/044; G06F 1/32; H03K 2017/9613; H03K 17/955; H04M 1/72569; H04B 1/3838
See application file for complete search history.

(56) References Cited

U.S. PATENT DOCUMENTS

| 9,723,434 | B1 | 8/2017 | Chang et al. | |
| 2007/0085157 | A1* | 4/2007 | Fadell | H04W 52/0254 |
| | | | | 257/428 |
| 2010/0214253 | A1 | 8/2010 | Wu et al. | |
| 2012/0280698 | A1* | 11/2012 | Oya | G06F 3/03547 |
| | | | | 324/658 |
| 2016/0057578 | A1 | 2/2016 | Rouaissia et al. | |
| 2016/0162068 | A1 | 6/2016 | Monney | |
| 2016/0366654 | A1* | 12/2016 | Dervisoglu | H04W 52/146 |
| 2018/0088739 | A1 | 3/2018 | Rouaissia et al. | |

FOREIGN PATENT DOCUMENTS

| CN | 105892775 A | 8/2016 |
| EP | 2950596 A1 | 12/2015 |
| EP | 2988479 A1 | 2/2016 |
| WO | WO-2013/079267 A1 | 6/2013 |

OTHER PUBLICATIONS

European Search Report for EP 19175441.5, dated Oct. 31, 2019; 8 pages.

* cited by examiner

*Primary Examiner* — Charles V Hicks
(74) *Attorney, Agent, or Firm* — Blank Rome LLP

(57) ABSTRACT

A capacitive proximity sensor for use in mobile devices such as smartphones and connected tables, in which it is used to switch off a display (70) when the device is brought to the ear, and to reduce selectively the RF power when the device is in close proximity to a body part of a user, in order to fulfil regulatory SAR limits. The capacitive sensor uses two electrodes (60, 30), the first of which may also serve as RF antenna, and the other is preferably on the back of the phone and is opposite the display.

10 Claims, 3 Drawing Sheets

PROXIMITY SENSOR AND MOBILE WIRELESS DEVICE

REFERENCE DATA

The present application claims the benefit of prior date of US provisional patent application 62/695,533 of Jul. 9, 2018, in the name of the same applicant. The entire contents of that application is incorporated herein by reference.

FIELD OF THE INVENTION

The present invention concerns a proximity sensor and a method for detecting the proximity of a body portion. Embodiments of the present invention concern wireless mobile devices, like mobile phones, personal computer or tablets that are equipped with the proximity sensor of the invention and, based on proximity signals generated by the sensor, can inhibit a display and/or a touch sensitive panel, and/or adapt a RF power of a radio transmitter.

DESCRIPTION OF RELATED ART

It is often desired to detect whether a body portion is at short distance of an apparatus. In the special case of cell phones and wirelessly connected mobile device, (including tablets and other similar terminals). This form of proximity detection can be used as an input to the apparatus, but, for RF-emitting devices, it is known to use a proximity indication to adapt the instantaneous RF power, to comply with SAR (Specific absorption Ratio) regulations. SAR is a measure of the amount of RF energy radiated in the human body when close to a radio emitting device (phone, tablet, laptop, etc.).

Other useful functions of portable connected devices that rely on proximity detection are: disabling the touch screen of a portable phone when it is brought to the ear for a call, lest the user may trigger unwanted actions by touching the screen with the cheek or the ear, and switching the screen backlighting off to economize energy, in the same situation.

Sensors arranged for detecting a body near to an object, including inductive, optical, heat, and capacitive based sensors, are known. In the cell phone market, the most common method today is a capacitive based sensor to detect an object near the RF antenna.

Capacitive sensors are often realized as metallized pads on a PCB but, in many cases, an existing element such as an antenna (i.e. conductive line), can double as a capacitive detector, such that the detector can be added with no surface penalty.

An example of capacitive sensor for proximity sensing in a mobile communication device is described in patent application EP2988479, in the name of the applicant, whose content is hereby included by reference.

BRIEF SUMMARY OF THE INVENTION

According to the invention, these aims are achieved by means of the object of the appended claims. In particular, these aims are achieved by a proximity sensor for a portable device arranged for detecting a body portion of an user in proximity of the portable device, having a first electrode and second electrode, both capacitively couplable with a body part of a user of the portable outside of the portable device; a readout circuit operatively arranged for acquiring a first capacity seen by the first electrode and a second capacity seen by the second electrode, and a to generate a directional proximity signal, as well as a second, omnidirectional, proximity signal based on said first capacity and second capacity.

Advantageous variants of the invention include a sensor as detailed above in which the first and second proximity signals are used, in a portable device, to switch off and on a touch-sensitive display, and to reduce the power of a RF transmitter, to respect regulatory SAR limits. Further embodiments relate to the inclusion of decoupling elements, by which the second electrode can be connected at the same time to the proximity readout circuit and to the RF transceiver, and function at the same time as RF antenna; to noise subtraction, pedestal subtraction and drift compensation in a digital processing unit of the readout circuit.

Other advantageous claimed variants of the invention relate to the generation of a directional proximity signal based on the difference, or on a weighted combination or on the ratio of the capacities seen by the electrodes, or else when a vector having as coordinates the first and second capacity falls in a predetermined region in a cartesian plane.

Further, when the invention is applied to a portable smartphone with a touch-sensitive screen, the first electrode would preferably be on the top of the phone, while the second one would preferably be on the back of the phone itself, opposite the display. The second electrode and/or the first one may have a shield electrode below, and/or a guard electrode in proximity, or above. Preferably, the shield and guard electrodes can be connected selectively to a voltage source or left in a high-impedance floating state.

In the context of this invention the directions "up", "down", "front", "back", refer to the normal orientation of a portable device, such as a mobile phone, with the screen facing the user and the loudspeaker up.

Further, the wording "directional" when applied to a proximity detection, indicates that the signals are processed in such a way that conductive bodies in a determined direction, for example in front of the electrode, are detected with higher sensitivity than other conductive bodies of similar characteristics in other directions, for example behind the electrode. This directional sensitivity may include combining the readings of two or more electrodes.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Although the present invention is applicable to vast array of devices including, but not limited to, cell phones, tablets, and laptop computers, examples of this description may refer simply to a phone. This should not be construed as a limitation of the invention, but merely as an example focusing on a particular implementation for concision's sake.

Figure 1:
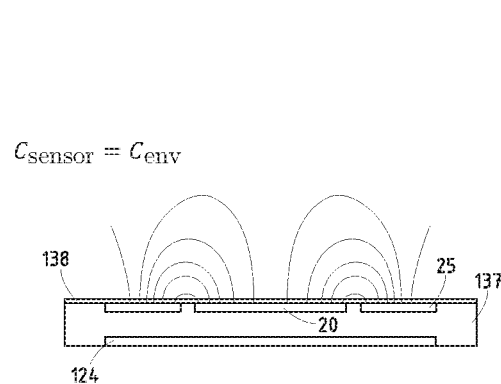
FIGS. 1 and 2 show, schematically and in cross-section, a capacitive sensor comprising a guard electrode and a back shield, far from conductive bodies, respectively in relation with an approaching conductive finger.

The functioning of a capacitive proximity detector suitable for the invention will now be recalled referring to figures. As illustrated in FIG. 1, capacitive sensors may use, as sense electrode, a conductive layer 20 on a printed circuit board or PCB 157. In the example, the electrode 20 is surrounded by a grounded ring-shaped guard electrode 25, backed by a shield electrode 23, and covered by a dielectric overlay 158, but none of these features is essential, as the shape that can be round, as shown or any other shape. The guard electrode 25 may be used to enhance the directivity of the detection, shielding the main electrode laterally. In possible variants, the guard electrode 25 may cover in part the main electrode 20, or else it may be configured as a grid overlaying the main electrode. By selectively connecting the guard electrode to the ground, or the same potential as the sense electrode 20, one can change the distance at which the electric field extends above the electrodes, and the detection range with that.

In free space, far from other conductive bodies, the capacitance of the sense electrode will have a baseline value: $C_{sensor}=C_{env}$, determined from the electric induction between the electrode and all the surrounding conductors.

Figure 2:
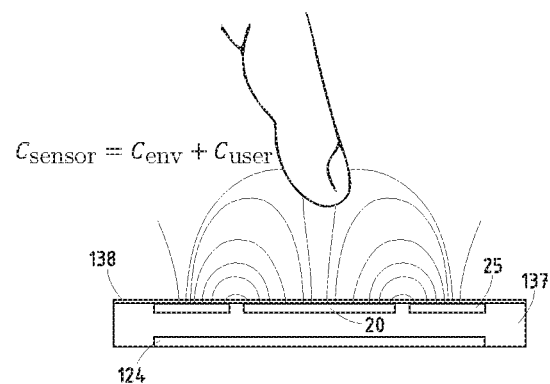

A conductive body in the proximity of the sensor, as the finger shown in FIG. 2, modifies the electric field distribution and, in general, induce an increase of the capacitance of the sense electrode: $C_{sensor}=C_{env}+C_{user}$.

It is well to realize that the increase $C_{user}$ may be much less than the baseline capacitance $C_{env}$. In a typical case, $C_{user}$ may be 1% of $C_{env}$, or even less. On the other hand, $C_{env}$ is hard to predict or simulate reliably, because it depends from several uncontrollable effects. Nevertheless, $C_{user}$ can be estimated by the formula below $$C_{User} = \frac{\varepsilon_0 \varepsilon_r A}{d}$$

where A is the common area between the two electrodes, hence the common area between the user's finger/palm/face and the sensor electrode 20, d their distance, and $\varepsilon_0$, $\varepsilon_r$ denote the absolute and relative dielectric permittivity. Conductive effects are neglected.

Figure 3:
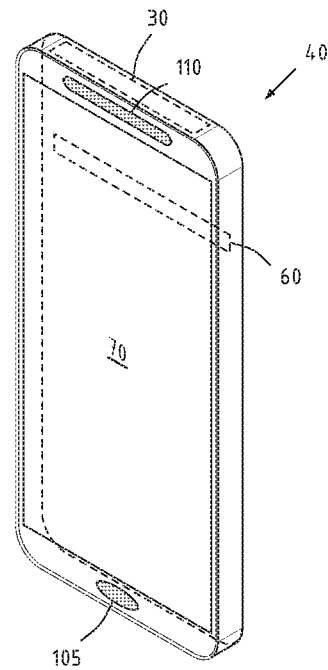
FIG. 3 shows a portable device with a capacitive sense electrode on the top, and one on the back. The first electrode doubles as RF antenna.

FIG. 3 illustrates a portable device, for instance a smartphone 40 The phone 40 includes a touch-sensitive screen panel 70 on a front side, as well as a microphone 105 and a loudspeaker 110 below, respectively above the screen 70. A desirable function of the phone is that, when the device is brought to the ear for a telephone conversation, the screen 70 should be disabled to reduce power consumption, and any contact between the screen and the user's cheek should be ignored.

The portable device 40 necessarily connects with other devices in the neighbourhood and/or in the internet by some form of radio connection. This typically includes Wi-Fi (IEEE 802.11), and/or Bluetooth®, and/or a mobile telephone network. When the user is close to the radio source, its tissues absorb energy from the electromagnetic radiofrequency field; the absorption rate (SAR) is limited by specific regulations. Another desired function of the portable device 40 is that the RF power should be limited when a user is nearby, to comply with these rules without compromising connectivity at all times.

The portable device 40 comprises at least two electrodes for capacitively measuring proximity of a part of the user's body. A first electrode 30 is also used as RF antenna for radio communication and is usually mounted near the top of the device. A second electrode 60 is used for spatial discrimination and directivity and may be mounted on the back of the phone, behind and/or opposite the touch screen 70.

Figure 4:
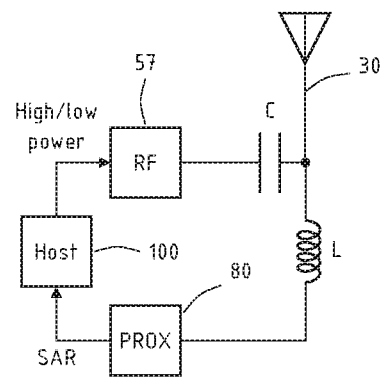
FIG. 4 shows a decoupling scheme of a capacitive electrode/antenna combination.

A same conductor can be used both as capacitive sense electrode and RF antenna by means of suitable decoupling. FIG. 4 illustrates a possible arrangement in which a conductor 30 is connected both to a RF transceiver 57 by means of a high-pass network—symbolized by the capacitor C—and to a proximity detection circuit 80 through a low-pass network—symbolized by an inductor L. When the proximity detection circuit senses that the user is close to the antenna 30, it informs the host 100 that causes the RF transmitter 57 to reduce the emission power. In a concrete implementation, the antenna may have a complex structure, with a plurality of segments, and shield and guard electrodes may be added, without departing from the general concept.

Figure 6:
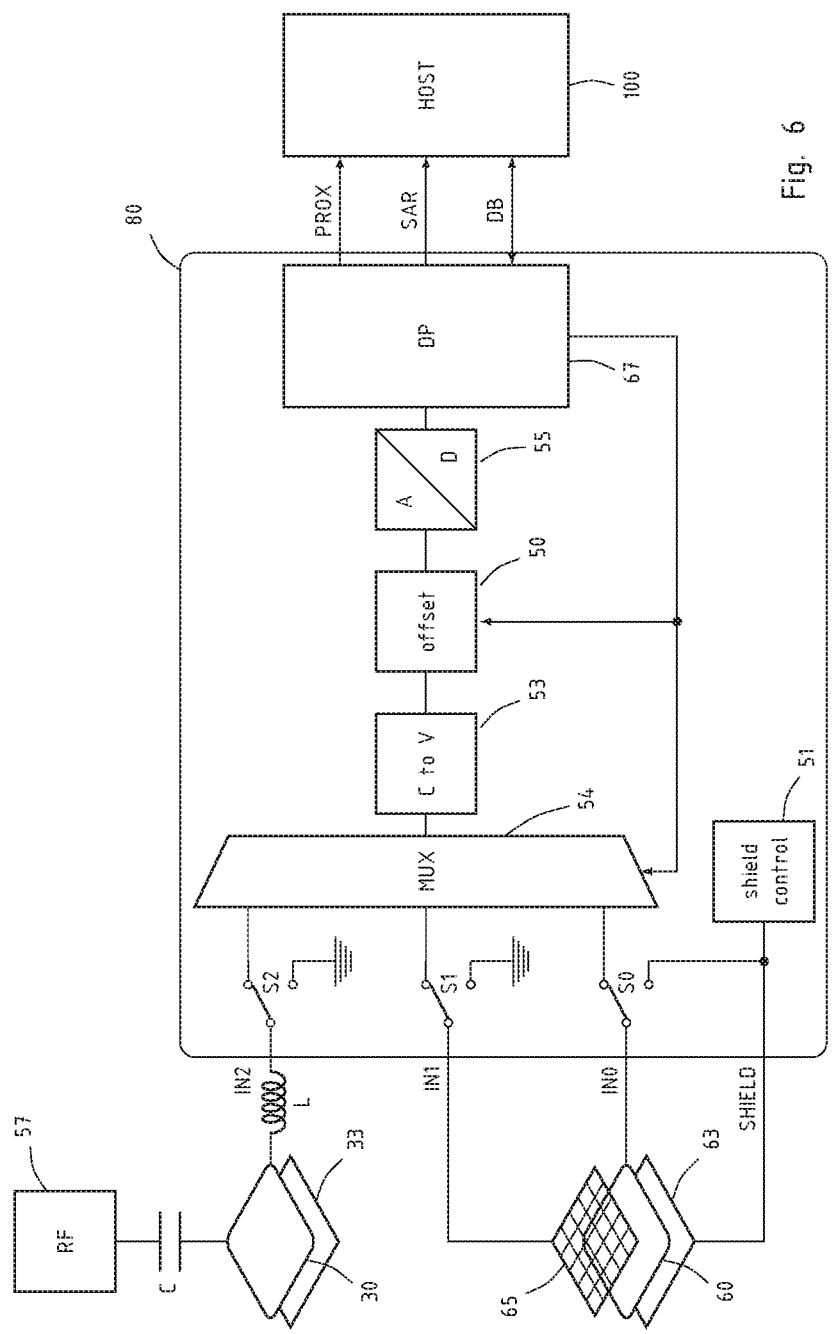
FIG. 6 shows the structure of a proximity detector according to an embodiment of the invention.

FIG. 6 shows a proximity detection circuit 80 arranged to read the capacities seen by two electrodes 30 and 60 as shown in the device of FIG. 3. The electrodes may have back shields 33, 63 that are permanently grounded, or connected to a shield control unit 51 that allows to tie them at a desired voltage or keep them floating. The second electrode 60 has a guard 65 (depicted here as a grid) whose capacity is read by a separate readout channel. Although the circuit 80 is drawn with three readout channels for reading the capacities seen by three electrodes, this is not a limiting feature of the invention and the number of channels could be lower, or higher, as needed.

The electrodes are connected to a capacity-to-voltage sub-circuit 53 through the multiplexer 54 that reads all the channels IN0-IN2 one by one in turn. The switches S0-S1 are preferably operated synchronously with the multiplexing cycle. The multiplexer is advantageous but is not an essential feature of the invention: parallel implementations are also possible.

The capacity-to-voltage sub-circuit 53 converts the capacity seen by the electrode into a suitable voltage signal and is followed by a programmable offset subtraction sub-circuit 50. As already mentioned, the proximity signal $C_{user}$ is superposed to a much larger baseline value $C_{env}$ that is neither known in advance nor stable. The digital processor 65 can estimate the value of the base capacity and compensate for it by programming suitable values in the offset subtraction sub-circuits 50. The compensated capacity signals are converted into numeric values by the ADC 55.

Figure 8:
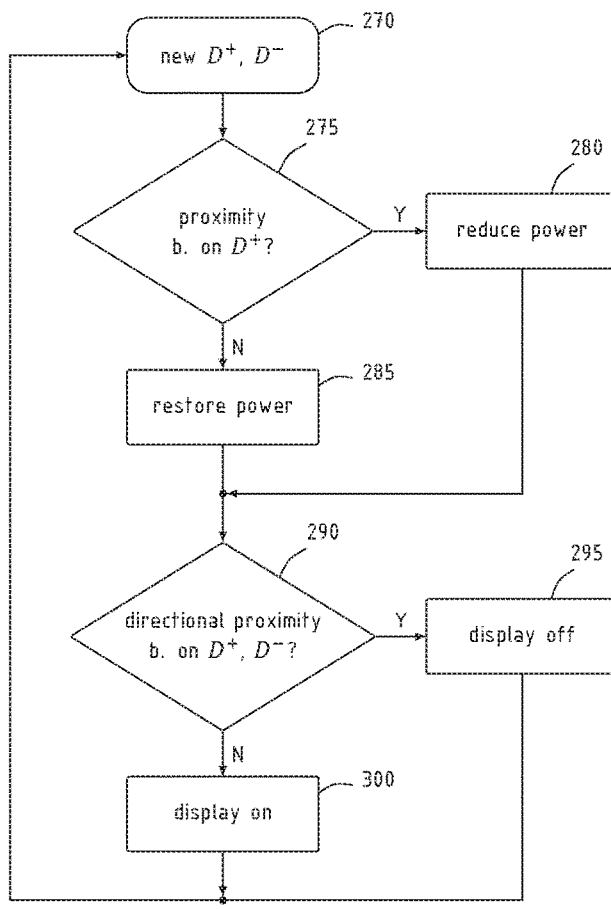
FIG. 8 shows in a chart the steps of generating a directional proximity signal and an omnidirectional SAR signal.

The proximity detection circuit 80 may communicate with a host processor 100 my means of a suitable data bus DB and produces one directional proximity logic flag (PROX) that signal the host that the operation of the screen 70 should be inhibited, and an omnidirectional SAR flag indicating that a part of the user's body is close to the antenna 30, and the RF power should be adapted. FIG. 8 illustrated this method in a workflow graph.

Figure 5:
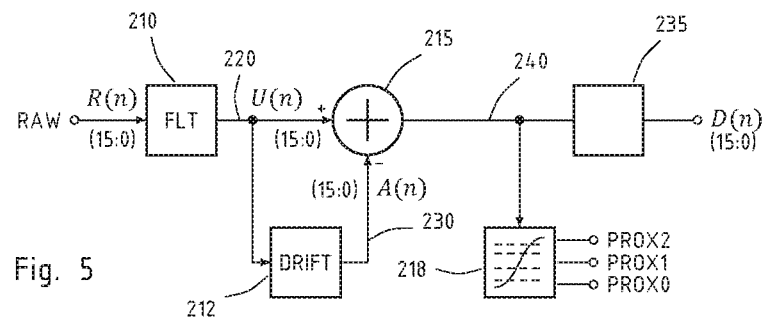
FIG. 5 illustrates schematically the architecture of a digital processor that could be employed in the frame of the invention.

FIG. 5 show in simplified fashion a possible architecture of the treatment carried out by the digital processor 65 for each channel. The raw samples R(n) from the ADC are treated by an input filter 210 to remove noise and yield the "useful" signal U(n). Input filter 210 can be a linear low-pass filter, or a nonlinear one. The drift estimation unit 212 determines a drift component superposed to the U(n) samples, which is subtracted at 215. Finally, 235 stands for additional processing including debouncing, overflow/underflow detection (which may trigger a baseline compensation), and so on.

The processed samples D(n) may be fed to a discriminator 218 to generate proximity flags or combined with the reading of other electrodes for directional detection, as described below.

Importantly, the proximity detector 80 generates a directional proximity signal (PROX) based on the capacities seen by the first electrode 30, respectively by the second electrode 60. Different objects in various spatial relationship with the phone will affect the capacities seen by the first and second electrode in different measure, and this can be used for a directional discrimination.

When the user approaches the phone to the ear, for example, the capacities seen by the first and second electrode will both increase, in a given proportion. This should be discriminated against other situations which should not trigger a proximity signal like device grips, when the user holds the telephone in the hand, and loads the back electrode 60 considerably more than the top electrode 30, and finger slides, when the device slides a finger on the screen while holding the phone.

In a possible variant of the invention, the proximity sensor decides whether a proximity flag is to be raised based on the ratio, between the capacities seen by the first and the second electrode, or on their difference, or on a linear combination of the first and second capacity.

Figure 7:
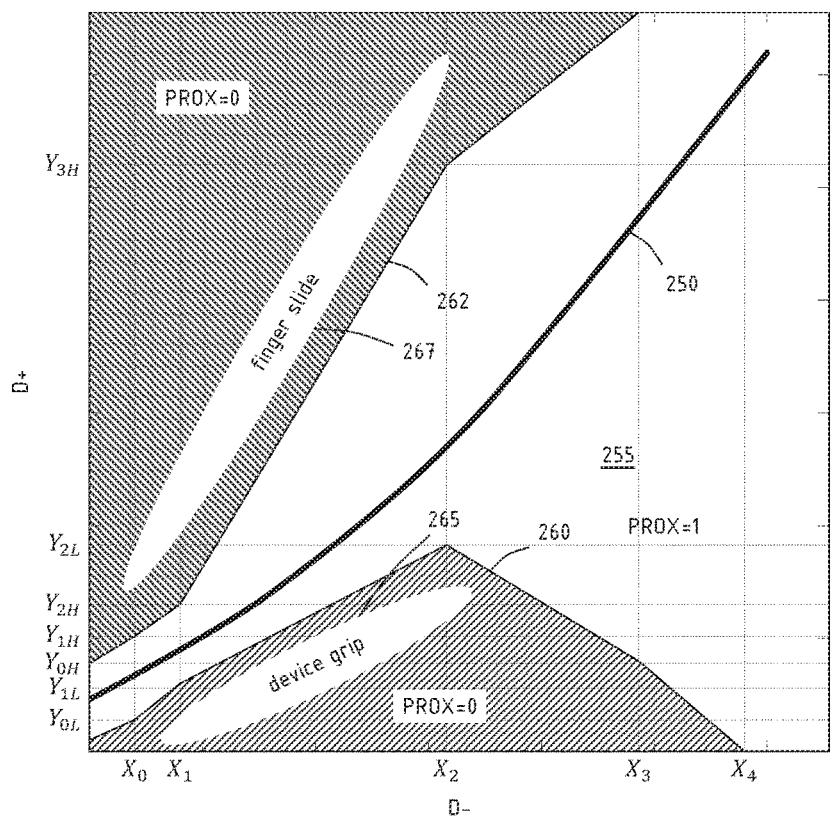
FIG. 7 plots the values of a directional proximity function based on the capacities seen by two electrodes, in an embodiment of the invention.

In a preferred variant, the proximity detection circuit 80 decides whether raising a proximity flag based on the position in a cartesian plane of a vector having the first and second capacity as components. FIG. 7 plots this situation. D− denotes the capacity of the back electrode 60 and D+ that of the top electrode 30. Device grip events cluster in a specific region 265, while finger slide events fall mostly in region 267. When the phone is brought to the ear, the capacities seen by both electrodes rise following, within a given approximation, curve 250. The detection circuit 80 is arranged to raise a proximity trigger when the vector defined by D+ and D− lies in the region 255 (white) between the lower threshold line 260 and the upper threshold line 262. Lower and upper thresholds are preferably programmable by the host system or preloaded in a firmware of the proximity circuit 80 and may be parameterized as piecewise linear functions, or in any other way.

At the same time as the directional proximity signal (PROX), the proximity circuit generates also a unidirectional proximity signal (SAR) that is used to reduce the RF power. In a favourable variant, the SAR signal is generated based on the capacity seen by the top electrode 30 that is also the RF antenna. This can be done simply by comparing the D+ digital signal against a threshold. More sophisticated processing is also possible and may consider, for example:
- the rate of change of the D+ signal. A user's approach is expected to be gradual. Abrupt changes are indication of a noise event, or of the intervention of a load-matching circuit, if the electrode 30 is also the RF antenna.
- The variance of the D+ signal. Little variation indicate that the telephone may be resting on a table rather than close to a body part.
- Contribution of the D− signal coming from the other electrode.

REFERENCE SYMBOLS USED IN THE FIGURES 20 sense electrode
25 guard electrode
30 top/first electrode/RF antenna
33 shield electrode
40 portable device
50 offset compensation
51 shield control
53 capacity-to-voltage converter
54 multiplexer
55 analogue-to-digital converter
57 RF transceiver
60 back/second electrode
63 shield electrode
65 partial guard electrode
65 digital processor
70 display
80 proximity detection circuit
100 host
105 microphone
110 loudspeaker
124 shield electrode
137 substrate
138 protection film
210 raw filter
212 drift estimation
215 adder
218 comparator
220 useful samples
230 estimated drift
235 additional processing
240 drift-subtracted samples
250 expected approach
260 lower threshold line
262 upper threshold line
265 expected region of device grip events
267 expected region of finger slide events
270 new samples available
275 decision step: proximity based on the antenna electrode
280 step of reducing RF power
285 step of restoring RF power
290 decision step: directional proximity based on two electrodes
295 switching off the display, or reacting to a proximity flag
300 switching on the display, or reacting to a reset of a proximity flag

The invention claimed is:

1. A proximity sensor for a portable device, the sensor being arranged for detecting a body portion of a user in proximity of the portable device; the sensor comprising: a first electrode capacitively couplable with a body part of a user of the portable outside of the portable device; a second electrode capacitively couplable with a body part of a user of the portable outside of the portable device; a readout circuit operatively arranged for acquiring a first capacity seen by the first electrode and a second capacity seen by the second electrode, and a to generate a directional proximity signal based on said first capacity and second capacity as well as a second proximity signal based on said first capacity and second capacity.

2. The proximity sensor of claim 1 in a portable device having a display and/or a touch sensitive panel, a radio transmitter, and a logic circuit operatively arranged to inhibit the display and/or the touch sensitive panel based on the directional proximity signal, and to reduce a transmission power of the radio transmitter based on the second proximity signal.

3. The proximity sensor of claim 2, the first electrode being part of a radiofrequency antenna of the portable device, and being connected to the radio transmitter and to the readout circuit through decoupling elements.

4. The proximity circuit of claim 1, wherein the readout circuit is arranged to generate digital values indicative of the raw capacities seen by the first electrode and/or the second electrode and to subtract a noise component and/or a pedestal component and/or a drift component from said digital values to obtain processed digital values, and to generate said directional proximity signal and second proximity signal based on said processed digital values.

5. The proximity circuit of claim 1, wherein the second proximity signal is generated when the first capacity of the first electrode fulfils predetermined criteria, and the directional proximity signal is generated when a linear combination of the first and second capacity exceeds a predetermined threshold, or a ratio of the first capacity on the second capacity exceeds a predetermined threshold.

6. The proximity circuit of claim 1, wherein the second proximity signal is generated when the first capacity of the first electrode fulfils predetermined criteria, and the directional proximity signal is generated when a vector having as coordinates the first and second capacity falls in a predetermined region in a cartesian plane.

7. The proximity circuit of claim 1, comprising one guard electrode in proximity the second electrode.

8. The proximity circuit of claim 1, in a portable phone, wherein the first electrode is on an upper part of the phone, relative to the position of normal use, and the second electrode is on a back side of the phone opposite to a touch-sensitive display.

9. A proximity sensor for a portable device, the sensor being arranged for detecting a body portion of a user in proximity of the portable device; the sensor comprising: a first electrode capacitively couplable with a body part of a user of the portable outside of the portable device; a second electrode capacitively couplable with a body part of a user of the portable outside of the portable device; a readout circuit operatively arranged for acquiring a first capacity seen by the first electrode and a second capacity seen by the second electrode, and a to generate a directional proximity signal based on said first capacity and second capacity as well as a second proximity signal based on said first capacity and second capacity, wherein the second proximity signal is generated when the first capacity of the first electrode fulfils predetermined criteria, and the directional proximity signal is generated when a linear combination of the first and second capacity exceeds a predetermined threshold, or a ratio of the first capacity on the second capacity exceeds a predetermined threshold, the portable device having a display and/or a touch sensitive panel, a radio transmitter, and a logic circuit operatively arranged to inhibit the display and/or the touch sensitive panel based on the directional proximity signal, and to reduce a transmission power of the radio transmitter based on the second proximity signal.

10. A proximity sensor for a portable device, the sensor being arranged for detecting a body portion of a user in proximity of the portable device; the sensor comprising: a first electrode capacitively couplable with a body part of a user of the portable outside of the portable device; a second electrode capacitively couplable with a body part of a user of the portable outside of the portable device; a readout circuit operatively arranged for acquiring a first capacity seen by the first electrode and a second capacity seen by the second electrode, and a to generate a directional proximity signal based on said first capacity and second capacity as well as a second proximity signal based on said first capacity and second capacity, wherein the second proximity signal is generated when the first capacity of the first electrode fulfils predetermined criteria, and the directional proximity signal is generated when a vector having as coordinates the first and second capacity falls in a predetermined region in a cartesian plane, the portable device having a display and/or a touch sensitive panel, a radio transmitter, and a logic circuit operatively arranged to inhibit the display and/or the touch sensitive panel based on the directional proximity signal, and to reduce a transmission power of the radio transmitter based on the second proximity signal.

\* \* \* \* \*